United States Patent
Lee et al.

(10) Patent No.: US 8,058,567 B2
(45) Date of Patent: Nov. 15, 2011

(54) HIGH DENSITY PACKAGE SUBSTRATE AND METHOD FOR FABRICATING THE SAME

(75) Inventors: Meng-Han Lee, Taoyuan County (TW);
Wei-Wen Lan, Taoyuan County (TW);
Ching-Ming Chuang, Taoyuan County (TW); Shi-Shyan James Shang, Taoyuan County (TW)

(73) Assignee: Nan Ya PCB Corp., Taoyuan County (TW)

( * ) Notice: Subject to any disclaimer, the term of this patent is extended or adjusted under 35 U.S.C. 154(b) by 675 days.

(21) Appl. No.: 12/175,094

(22) Filed: Jul. 17, 2008

(65) Prior Publication Data
US 2009/0283315 A1    Nov. 19, 2009

(30) Foreign Application Priority Data
May 16, 2008   (TW) .............................. 97118079 A

(51) Int. Cl.
*H05K 1/11* (2006.01)

(52) U.S. Cl. .................. 174/262; 174/264; 174/266
(58) Field of Classification Search ........... 174/260–266
See application file for complete search history.

(56) References Cited

U.S. PATENT DOCUMENTS

| | | | |
|---|---|---|---|
| 2004/0136152 A1* | 7/2004 | Mitsuhashi et al. | 361/683 |
| 2008/0314632 A1* | 12/2008 | Wu et al. | 174/263 |

* cited by examiner

*Primary Examiner* — Dameon Levi
*Assistant Examiner* — Hoa C Nguyen

(57) ABSTRACT

The invention provides a high density package substrate and a method for fabricating the same. A double-sided copper clad laminate containing an upper copper foil and a lower copper foil is provided. A bottom pad is disposed on the lower copper foil, aligned to a predetermined position of a through hole. The through hole is formed by laser drilling through the upper copper foil and the substrate, but not through the bottom pad. A seed layer is formed conformally lining the through hole, and a metal layer is formed on the seed layer by plating to form a plated through hole (PTH).

11 Claims, 5 Drawing Sheets

HIGH DENSITY PACKAGE SUBSTRATE AND METHOD FOR FABRICATING THE SAME

CROSS REFERENCE TO RELATED APPLICATIONS

This Application claims priority of Taiwan Patent Application No. 097118079, filed on May 16, 2008, the entirety of which is incorporated by reference herein.

BACKGROUND OF THE INVENTION

1. Field of the Invention

The present invention relates to a high density package substrate and method for fabricating the same, and in particular relates to a method for forming a high density package substrate by laser drilling.

2. Description of the Related Art

Along with technological development, electrical devices are becoming lighter, thinner, shorter and smaller. As such, printed circuit boards in electrical devices are also being required to become lighter, thinner, shorter and smaller. Thus, high density interconnection (HDI) technology, allowing for high density interconnection, fine spacers and miniaturization, is being used in printed circuit boards to provide increased functions in a limited space and further decrease fabrication process costs. For HDI technology, via-on-pad, with a plated through hole formed on a pad, is utilized. Additionally, because a conventional mechanical drill destroys copper foils of a double-sided copper clad laminate, laser drills are used to more accurately control the location and size of holes for the via-on-pad.

There are three main methods for forming the plated through hole of the double-sided copper clad laminate. The first method is a full-subtractive process, the second method is a semi-subtractive process and the third method is a modified semi-additive process.

The thickness of the double-sided copper clad laminate copper foil used in the full-subtractive process is generally about 12 μm (or 18 μm). When the through hole is formed by laser drilling, the thickness of the lower copper foil is at least larger than 12 μm, so that a punch through problem caused by a laser drill is prevented. However, on the other hand, the thick copper foil increases etching time. Therefore, increasing etching time worsens an undercut phenomenon of the printed circuit board and negatively affects the forming of fine lines.

The thickness of the double-sided copper clad laminate copper foil used in the semi-subtractive process and the modified semi-additive process is generally only about 4 μm. The advantage of both processes is that the thinner copper foil improves the undercut phenomenon of the printed circuit board and improves forming of fine lines. However, the ultra-thin copper foil causes other problems, such as complicating the laser drilling process, increasing costs and increased probability of punch through.

Accordingly, there is a need to develop a process, which not only prevents the punch through caused by laser drilling, but also allows the double-sided copper clad laminate to have fine line capability.

BRIEF SUMMARY OF THE INVENTION

An object of the invention is to provide a high density package substrate and method for fabricating the same, which can prevent punch through caused by laser drilling and allow the substrate to have fine line capability.

The present invention provides a method for forming a high density package substrate, comprising: providing a double-sided copper clad laminate having an upper copper foil and a lower copper foil; forming a bottom pad on the lower copper foil, wherein the bottom pad is aligned to a predetermined position of a through hole; forming the through hole by laser drilling, wherein the through hole passes through the upper copper foil and the substrate, but not through the bottom pad; forming a seed layer conformally on the through hole; and forming a plated through hole by plating a metal on the seed layer.

The present invention also provides a high density package substrate, comprising: a substrate; an upper copper foil formed on the upper side of the substrate; a seed layer conformally formed on the through hole; a metal disposed on the seed layer and filled the through hole; a lower copper foil formed on a lower surface of the substrate; and a bottom pad directly formed on the lower copper foil and aligned to the through hole.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

The following description of FIG. 1A to FIG. 1I is used to describe the fabrication method of a high density package substrate of the invention. The drawings are idealized representations for better illustration of the methods of the invention, and various elements are not necessarily shown to scale.

Figure 1A:
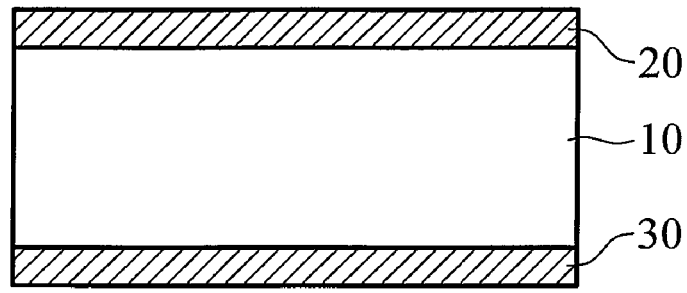
FIG. 1A~FIG. 1I are cross sections of a fabricating method for a high density package substrate in accordance with embodiments of the invention

Referring to FIG. 1A, a double-sided copper clad laminate 10 having an upper copper foil 20 and a lower copper foil 30 is provided. The copper foil is an ultra-thin foil, with a thickness of about 4 μm or below. The double-sided copper clad laminate 10 comprises a core material of insulating materials, such as paper phenolic resin, composite epoxy, polyimide resin or glass fiber. The copper foil is formed by sputtering, laminating, coating or other well-known methods.

Figure 1B:
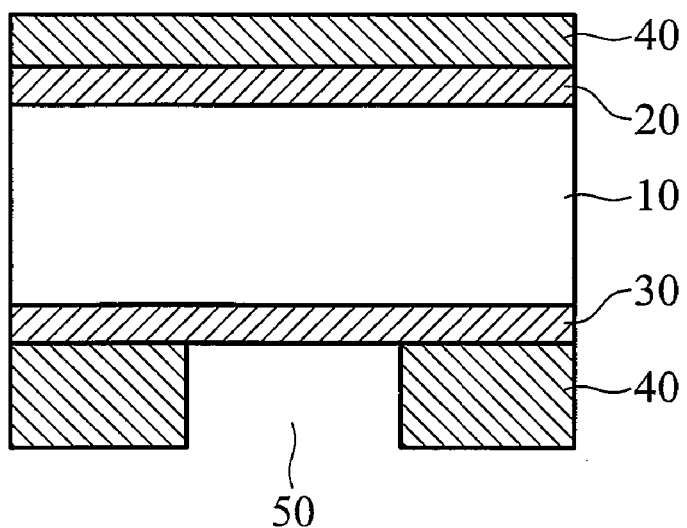
Figure 1C:
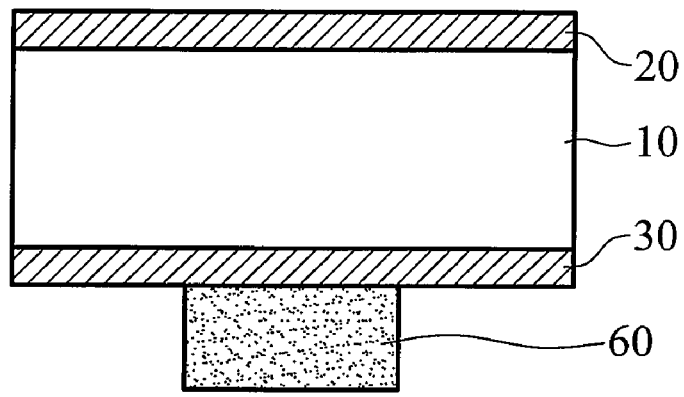

Referring to FIG. 1B to FIG. 1C, in order to prevent the punch through problem caused by laser drilling, a bottom pad 60 is directly formed on the lower copper foil 30, wherein the bottom pad 60 is aligned to a predetermined position of a through hole 80.

Referring to FIG. 1B, a first photoresist 40 is coated on the upper copper foil 20 and the lower copper foil 30. The first photoresist 40 is a dry film photoresist, which is well-known to those of ordinary skill in the art. Under suitable pressure and temperature, the dry film is hermetically adhered on the substrate. Next, a first opening 50 is formed in the first photoresist 40 by a photolithography process, wherein the first opening 50 is aligned to the predetermined position of the bottom pad 60.

As shown in FIG. 1C, the bottom pad 60 is formed in the first opening 50 by a plating process. The bottom pad 60 comprises copper, aluminum, nickel, gold or combinations thereof, among which, copper is particularly preferred. The thickness of the bottom pad 60 should be sufficient to prevent the punch through problem caused by laser drilling. The thickness of the bottom pad 60 is normally 12 μm to 18 μm, dependant upon the types of laser and the thickness of the lower copper foil 30. It should be noted that an area of the bottom pad 60 is preferred to be larger than the size of the through hole 80. The first photoresist 40 is removed by conventional stripping methods.

Figure 1D:
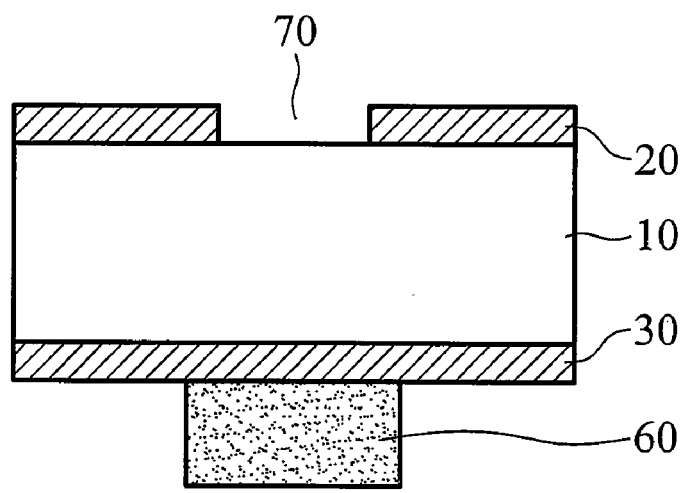

As indicated in FIG. 1D, a second opening 70 is formed on the upper copper foil 20 by a photolithography process to define the location of laser drilling. Alternatively, the step of FIG. 1D can be omitted to proceed with the step of FIG. 1E directly. For example a well-known direct laser drilling (DLD) method is applied to the location for laser drilling.

Figure 1E:
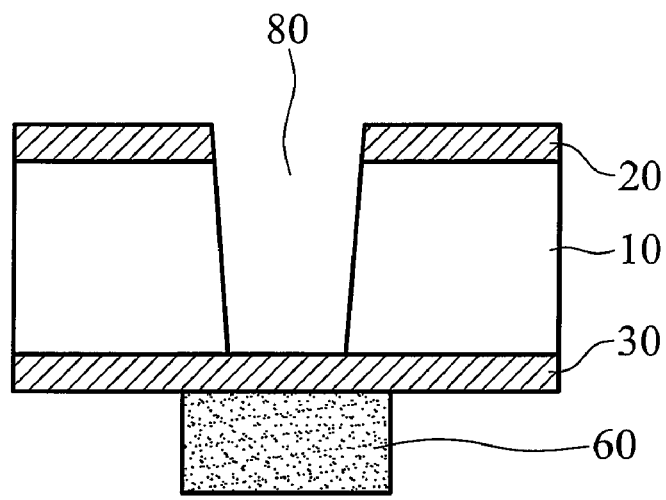

Referring to FIG. 1E, a through hole 80 is formed along the second opening 70 by laser drilling the double-sided copper clad laminate. Since the bottom pad 60 has been formed under the through hole 80, the punch through problem caused by laser drilling can be avoided. In one embodiment, a $CO_2$ laser is preferred. With increased power and sustained discharge, a $CO_2$ laser is produced by doping with other gases, such as $N_2$, He or Co.

Then, resin smear produced by the laser drill is cleaned by a well-known desmear processes.

Figure 1F:
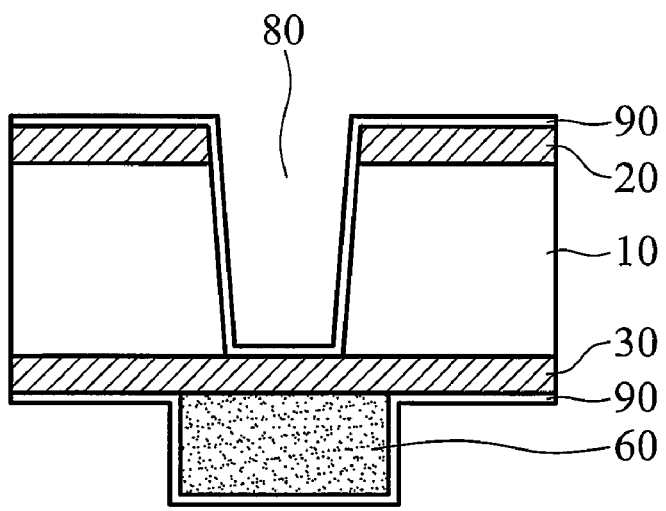

As shown in FIG. 1F, a seed layer 90 is formed conformally on through hole 80, the upper copper foil 20 and the lower copper foil 30 by a plating process, wherein the seed layer comprises copper, tantalum or combinations thereof. The seed layer is preferably formed by an electroless plating process.

Figure 1G:
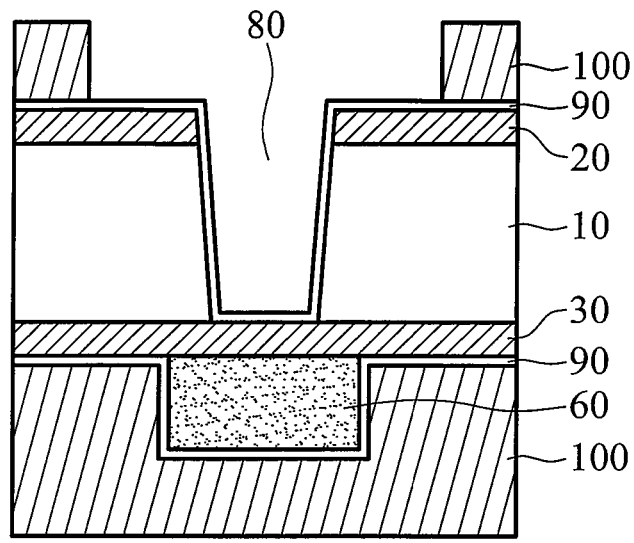
Figure 1H:
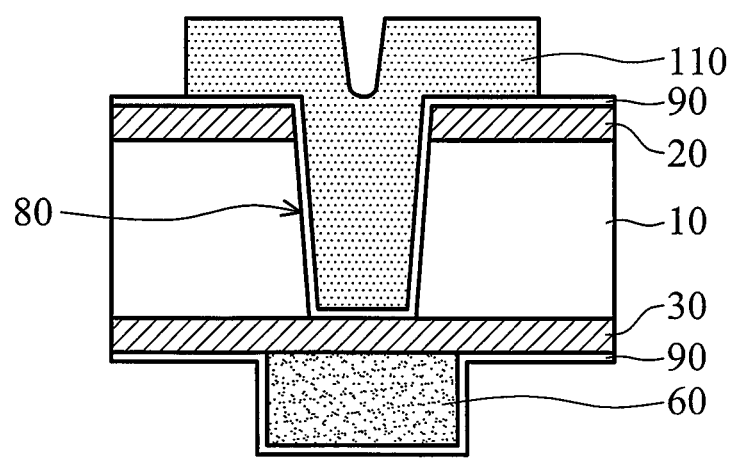

Referring to FIG. 1G, the seed layer 90 is coated with a second photoresist 100, and the second photoresist 100 is patterned by a photolithography process to expose the seed layer 90 within the through hole 80. As indicated in FIG. 1H, the exposed seed layer 90 is plated with a metal 110 by a patterned plating process. Suitable examples of the metal 110 comprise copper, aluminum, nickel, gold or combinations thereof. Among them, copper is preferred. Next, the patterned second photoresist 100 is removed by a stripping process.

Figure 1I:
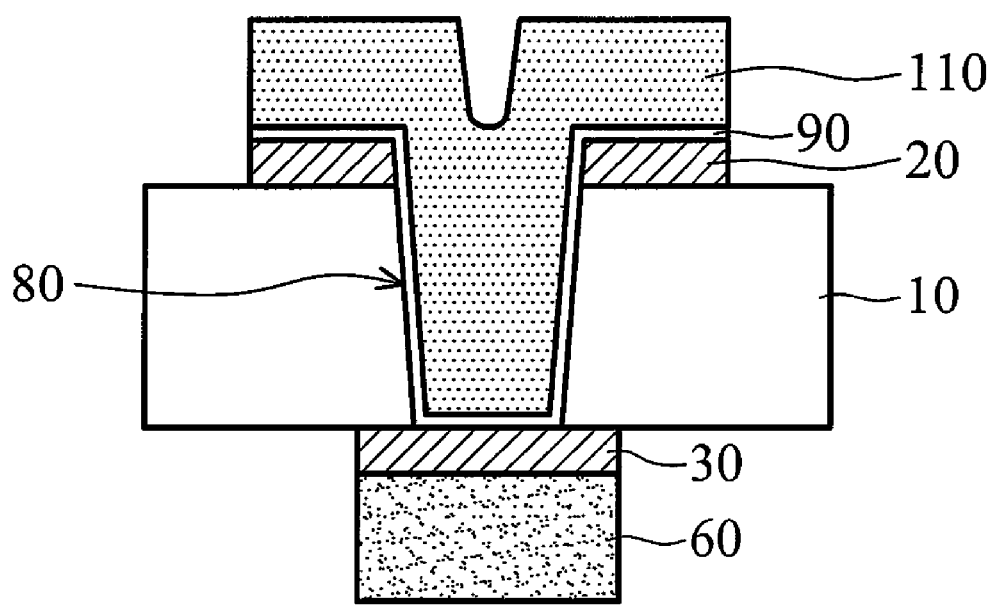

As indicated in FIG. 1I, a double-sided copper clad laminate with a plated through hole is obtained by etching the seed layer 90, the upper copper foil 20 and the lower copper foil 30 outside of the plated metal. The required etching thickness is only the total thickness of the seed layer 90 and the upper copper foil 20 in the final step, which is thinner than that of the conventional full-subtractive method. Thus, the etching time for the double-sided copper clad laminate of the invention is shorter than that of the full-subtractive method. Additionally, the undercut phenomenon of the printed circuit board is prevented and fine line capability is improved.

As shown in FIG. 1I, the high density package substrate of the invention comprises a substrate 10 having the upper copper foil 20 and the lower copper foil 30, wherein the thickness of the upper or lower copper foil is preferably about 4 μm or below. A bottom pad 60 is formed directly on the lower copper foil 30 and aligned to a predetermined position of a through hole 80. The bottom pad 60 has an area larger than the size of the through hole 80, for the purpose of preventing the punch through problem caused by laser drilling. The bottom pad 60 has a thickness of about 12 μm or above. Suitable examples of the bottom pad 60 comprise copper, aluminum, nickel, gold or combinations thereof. The through hole 80 is formed by laser drilling through the upper copper foil 20 and the substrate 10, but not through the bottom pad 60. A seed layer 90 is formed conformally along the through hole 80 and the upper copper foil 20, but there is no seed layer 90 between the bottom pad 60 and the lower copper foil 30. A metal layer 110 is formed on the seed layer 90 by a plating process.

According to the above description, the method for fabricating the high density package substrate of the invention has two major advantages:

(1) Because the bottom pad is formed on the lower copper foil in advance, the punch through problem caused by laser drilling is prevented. The probability of the punch through caused by laser drilling and the cost of the laser process of the invention are decreased as compared with the conventional semi-subtractive method.

(2) Since the upper or lower copper foil of the substrate is an ultra-thin copper foil, the etching time of the printed circuit board is decreased, the undercut phenomenon is insignificant and the printed circuit board has fine line capability. The fine line capability of the invention is better than the conventional semi-subtractive method.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A high density package substrate, comprising:
   a substrate;
   an upper copper foil formed on the upper side of the substrate;
   a lower copper foil formed on a lower surface of the substrate;
   a through hole through the upper copper foil and the substrate;
   a seed layer conformally formed on the through hole, the upper foil and the lower foil;
   a metal disposed on the seed layer and filled the through hole; and
   a bottom pad directly formed on the lower copper foil and aligned to the through hole, wherein the bottom pad is covered by the seed layer.

2. The high density package substrate as claimed in claim 1, wherein the substrate comprises a core material of paper phenolic resin, composite epoxy, polyimide resin or glass fiber.

3. The high density package substrate as claimed in claim 1, wherein each of the upper copper foil and the lower copper foil has a thickness of smaller than 4 mm.

4. The high density package substrate as claimed in claim 1, wherein the through hole is formed by laser drilling.

5. The high density package substrate as claimed in claim 4, wherein the laser drill uses a $CO_2$ laser.

6. The high density package substrate as claimed in claim 1, wherein the seed layer comprises copper, tantalum or combinations thereof.

7. The high density package substrate as claimed in claim 1, wherein the bottom pad comprises copper, aluminum, nickel, gold or combinations thereof.

8. The high density package substrate as claimed in claim 1, wherein the metal comprises copper, aluminum, nickel, gold or combinations thereof.

9. The high density package substrate as claimed in claim 1, wherein the bottom pad has an area larger than the size of the through hole.

10. The high density package substrate as claimed in claim 1, wherein the bottom pad has a thickness of larger than 12 µm.

11. The high density package substrate as claimed in claim 1, wherein no seed layer is provided between the bottom pad and the lower copper foil.

* * * * *